United States Patent [19]

Chung et al.

[11] Patent Number: 5,066,604
[45] Date of Patent: Nov. 19, 1991

[54] METHOD FOR MANUFACTURING A SEMICONDUCTOR DEVICE UTILIZING A SELF-ALIGNED CONTACT PROCESS

[75] Inventors: In S. Chung, Kyungki; Dai H. Lee, Seoul, both of Rep. of Korea

[73] Assignee: Hyundai Electronics Industries Co., Ltd., Kyungki, Rep. of Korea

[21] Appl. No.: 578,563

[22] Filed: Sep. 6, 1990

[30] Foreign Application Priority Data

Sep. 8, 1989 [KR] Rep. of Korea .................. 89-12998

[51] Int. Cl.⁵ .................. H01L 21/28; H01L 21/336
[52] U.S. Cl. ..................................... 437/44; 437/186; 437/233; 437/940; 437/968; 437/41
[58] Field of Search ............. 437/40, 42, 43, 940, 437/968, 186, 233, 41, 44

[56] References Cited

U.S. PATENT DOCUMENTS

| | | | |
|---|---|---|---|
| 3,899,373 | 8/1975 | Antipov | 437/186 |
| 4,136,434 | 1/1979 | Thibault et al. | 437/41 |
| 4,403,392 | 9/1983 | Oshima et al. | 437/186 |
| 4,666,556 | 5/1987 | Fulton et al. | 156/643 |
| 4,819,055 | 4/1989 | Nakazato et al. | 357/59 |
| 4,868,138 | 9/1989 | Chan et al. | 437/44 |
| 4,874,716 | 10/1989 | Rao | 437/43 |
| 5,010,039 | 4/1991 | Ku et al. | 437/233 |

FOREIGN PATENT DOCUMENTS

| | | | |
|---|---|---|---|
| 0013020 | 3/1981 | Japan | 437/186 |
| 0158455 | 12/1981 | Japan | 437/186 |

Primary Examiner—Olik Chaudhuri
Assistant Examiner—M. Wilczewski
Attorney, Agent, or Firm—Merchant, Gould, Smith, Edell, Welter & Schmidt

[57] ABSTRACT

A method for manufacturing a semiconductor device utilizing a self-aligned contact process is disclosed. The method for manufacturing the same provides a conducting layer which is selectively connected in self-aligned contact, through contact holes, to predetermined electrodes of a plurality of electrodes in a semiconductor device, and provides a thermal oxide layer having a sufficient thickness to insulate the conducting layer from the other electrodes. So that a selective connection between the conducting layer and the predetermined electrode which are to be connected to each other is successively achieved within a more decreased cell size, while maintaining a sufficient thickness of an insulating layer between the conducting layer and the other electrodes which must be insulated from each other.

20 Claims, 3 Drawing Sheets

METHOD FOR MANUFACTURING A SEMICONDUCTOR DEVICE UTILIZING A SELF-ALIGNED CONTACT PROCESS

BACKGROUND OF THE INVENTION

1. Field of the Invention

The invention relates to a method for manufacturing a semiconductor device utilizing a self-aligned contact process, and more particularly, to a method for manufacturing the same to provide a more highly integrated semiconductor device in which an insulating layer is formed by selectively oxidizing a polysilicon layer over regions of the device to form an insulating layer of varying thickness. The thickness of the insulating layer positioned at the contact region is minimized for easy removal during oxide etching, while sufficient thickness is maintained over the remainder of the structure to insulate the unconnected electrodes relative to each other.

2. Information Disclosure Statement

Generally, in order to selectively connect a conducting layer to selected electrodes of a plurality of electrodes which are formed in a semiconductor device, an insulating layer is deposited on the entire surface of the resulting semiconductor device. A photoresist layer is then formed on the insulating layer and, by a mask patterning process, a portion of the photoresist layer is selectively removed by lithographically etching the photoresist layer formed on the electrodes which are selected to be connected later, thereby exposing a portion of the insulating layer. Contact holes are formed by etching the exposed portion of the insulating layer. Thereafter, the remaining photoresist layer is removed and the conducting layer is deposited on the entire surface of the resulting structure, thereby selectively connecting the conducting layer through the contact holes to the selected electrodes.

However, with the prior art method, when the contact holes are formed by the lithographic etching of the insulating layer, there is a problem in that a distance must be required for a minimum misalignment tolerance required for the mask patterning process and a critical dimension loss occurred during the lithographic etching process, thereby decreasing the integrity of semiconductor device, and leakage current and parasitic capacitance can be incurred between the conducting layer and the electrode which has to be insulated therefrom due to forming the insufficient thickness of the resulting insulating layer formed therebetween.

Accordingly, it is an object of the present invention to solve the problems set forth above, and to provide a method for manufacturing a semiconductor device utilizing a self-aligned contact process, which can easily perform the contact forming process so that the integrity of semiconductor device highly increases.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for manufacturing a semiconductor device utilizing a self-aligned contact process of the present invention is defined by the claims with a specific embodiment shown in the claims. For the purpose of summarizing the invention, the invention relates to a method for manufacturing a semiconductor device, which comprises forming a plurality of oxide layers for segment separation on a silicon substrate, with each oxide layer for segment separation being spaced apart relative to one other. A gate oxide layer is deposited on the silicon substrate extending between the spaced apart oxide layers. A conducting layer for gate electrode is then deposited over the entire surface of the resulting structure. Portions of the conducting layer are removed. The portions of the conducting layer which remain to form a plurality of gate electrodes on the gate oxide layer and a plurality of gate electrode lines on a portion of each oxide layer for segment separation, with each gate electrode being spaced apart relative to one other. A plurality of lightly doped diffusion (hereinafter referred to as "LDD") regions are formed within each portion of the silicon substrate extending between the spaced apart oxide layers that is not covered by a gate electrode. An oxide spacer layer is deposited on the entire surface of the resulting structure. A plurality of oxide spacers are formed on each side of each gate electrode of the plurality of gate electrodes and on each side of each gate electrode lines of the plurality of gate electrode lines. A diffusion region is formed through each LDD region of the plurality of LDD regions into the silicon substrate underlying each LDD region to thereby form a plurality of diffusion regions. Each diffusion region of the plurality of diffusion regions functions, in use, as a drain electrode or a source electrode. A plurality of MOSFETs are formed by depositing a first insulating layer on each gate electrode, each gate electrode line and each oxide spacer of the plurality of oxide spacers.

An undoped polysilicon layer is deposited on the entire surface of the resulting structure which comprises the first insulating layer, portions of oxide layers for segment separation and portions of gate oxide layer. A nitride layer and a photoresist layer are sequentially formed over the undoped polysilicon layer. The photoresist layer is removed from the nitride layer except for those portions of the photoresist layer positioned above each gate electrode line and above each diffusion region. Thus, the nitride layer is exposed except for those portions of the nitride layer positioned above each gate electrode line and above each diffusion region. At this point in the method, contact regions are defined as those regions over diffusion regions positioned between the gate electrodes of the MOSFETs of the plurality of MOSFETs and as those regions positioned over each gate electrode lines, respectively. The nitride layer is removed except for those portions of the nitride layer positioned at the defined contact regions, thereby exposing portions of the undoped polysilicon layer. An ion-implantation process is performed on the exposed portions of the undoped polysilicon layer to thereby form the exposed portions into a doped polysilicon layer. The photoresist layer remained above each gate electrode line and above each diffusion region of the plurality of diffusion regions positioned between adjacent gate electrodes is removed, thereby exposing the nitride layer remained at the defined contact regions. The exposed doped polysilicon layer is thermally oxidized thereby forming a thermal oxide layer on and into the exposed doped polysilicon layer. The nitride layer positioned above each gate electrode line and each diffusion region of the plurality of diffusions regions positioned between adjacent gate electrode is removed, thereby exposing the underlying undoped polysilicon layer. The exposed underlying undoped polysilicon layer is removed to expose the first oxide layer formed on each gate electrode line and to expose the gate oxide layer formed over the diffusion region positioned between the gate electrodes, respectively. A contact hole is then formed at each contact region by etching the thermal oxide layer, the exposed gate oxide layer positioned over the diffusion region and the first oxide layer positioned on the each gate electrode line to expose a surface of each gate electrode lines and a surface of each diffusion region positioned between gate electrodes of the plurality of gate electrodes, respectively. A conducting layer is then deposited on the entire surface of the resulting structure which comprises the thermal oxide layer and the contact holes. The conducting layer is removed except for those portions of the conducting layer deposited in and proximate to each contact hole such that each portion of the conducting layer forms a contact at each gate electrode lines, respectively, and a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

The ion-implantation process described uses a dopant source selected from the group consisting of: B(Boron), BF$_2$ (Boron-Fluorine), P(Phosphorus) or As(Arsenic), to dope the exposed portion of the undoped polysilicon layer.

The above described method may be altered by doping the entire undoped polysilicon layer after the undoped polysilicon layer has been deposited to form a doped polysilicon layer. In this event the ion-implantation process step is not needed since the polysilicon layer is already doped.

Thus, the deposited undoped polysilicon may be doped by heating the undoped polysilicon layer at a temperature of 700°-1000° C. degree Celsius for a period of 10-100 minutes with simultaneously application of POCl$_3$ (Phosphorus-Oxygen-Chlorine) gas, to diffuse the impurity contained the gas into the undoped polysilicon layer.

The entire undoped polysilicon layer may also be doped by depositing on the undoped polysilicon layer a solid dopant source selected from the group consisting of: BN(Boro-Nitride), BSG(Boro-Silicate-Glass), BPSG(Boro-Phospho-Silicate-Glass) or PSG(Phospho-Silicate-Glass), at a thickness of 100-2000 Angstroms, and heating the solid dopant source deposited on the undoped polysilicon layer at a temperature of 700-1000 degrees Celsius for a period of 10-100 minutes, to diffuse the impurity contained the solid dopant source into the undoped polysilicon layer.

Where the entire undoped polysilicon layer has been doped, the method proceeds according to the above described method, except there is no undoped polysilicon layer present. Thus, after the thermal oxidation step when the nitride layer positioned above each gate electrode line and each diffusion region of the plurality of diffusions regions positioned between adjacent gate electrodes is removed, the underlying layer exposed at each nitride layer removal site is doped polysilicon layer.

The exposed doped polysilicon layer is preferably thermally oxidized at a temperature of 200-1000 degrees Celsius for a period of about 10-120 minutes.

Preferably, the doped polysilicon layer formed by the above described processes has an impurity-concentration of abut $1 \times 10^{18} - 5 \times 10^{21}$ cm$^{-3}$.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
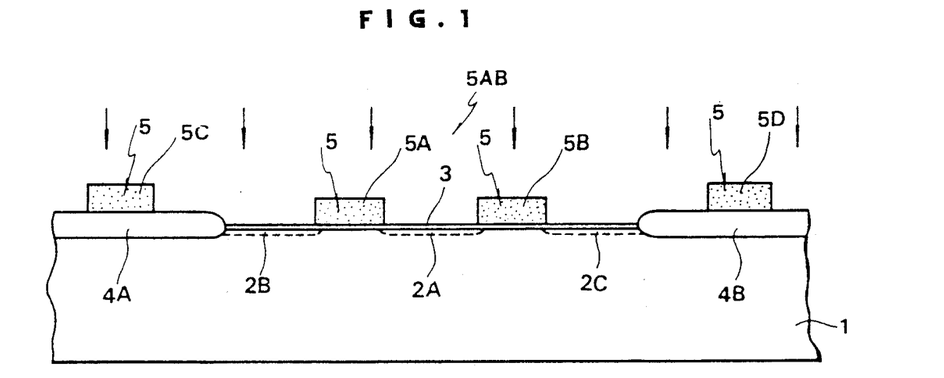
FIG. 1 illustrates a cross-sectional view of a partially completed semiconductor device in which a gate oxide layer, field oxide layers for segment separation, gate electrodes and gate electrode lines are formed on a silicon substrate.
Figure 2:
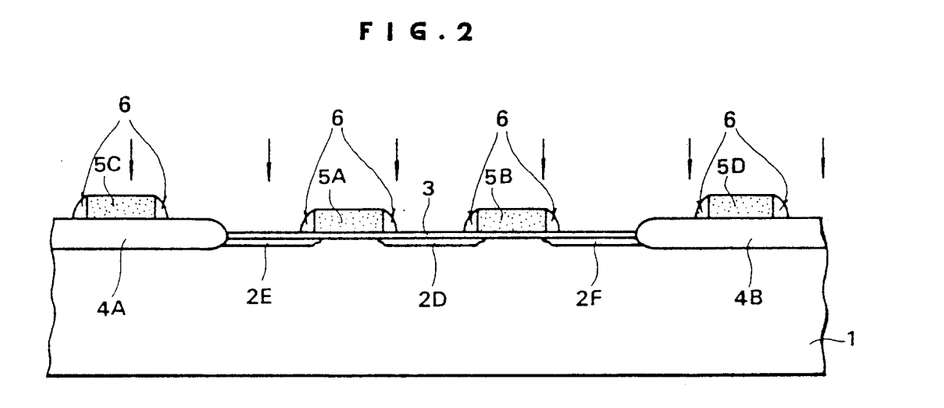
FIG. 2 illustrates a cross-sectional view of a partially completed semiconductor device in which oxide spacers are formed at both sides of the gate electrodes and on the gate electrode lines, respectively.
Figure 3:
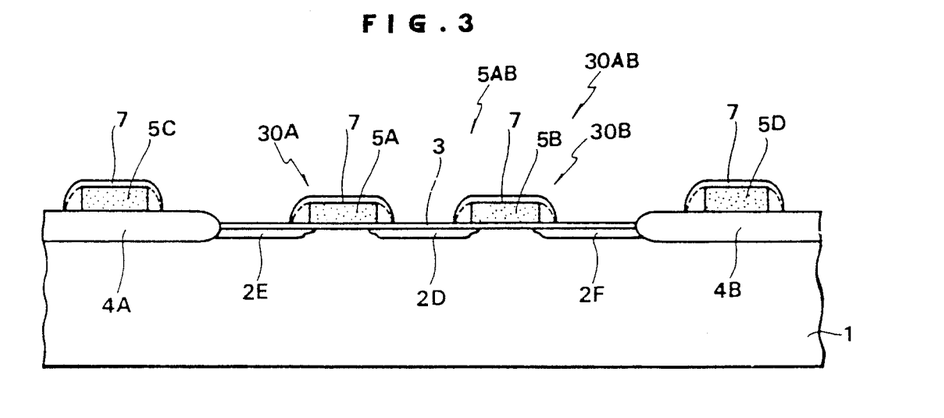
FIG. 3 illustrates MOSFETs formed on the silicon substrate in which a first oxide layer is formed on the gate electrodes and on the gate electrode lines.

FIG. 1 through 3 are sectional views of partially completed semiconductor device according to the process steps of the prior art for manufacturing a semiconductor device on a semiconductor substrate.

Referring to FIG. 1, oxide layers 4A and 4B for segment separation are formed on the silicon substrate 1, with each segment separation oxide layer 4A and 4B being spaced apart relative to each other. A gate oxide layer 3 is deposited, as thick as for example 100-500 Angstroms, on the silicon substrate 1 so as to extend between the oxide layers 4A and 4B for segment separation. A conducting layer 5 for gate electrode is then deposited, as thick as for example 1500-5000 Angstroms, on the entire surface of the resulting structure. A portion of the conducting layer 5 is removed by a mask patterning process of the conducting layer 5, to form a plurality of gate electrodes 5AB on that portion of the gate oxide layer 3 extending between oxide layers 4A and 4B and to also form gate electrode lines 5C and 5D on a portion of the each oxide layer 4A and 4B. Each gate electrode 5A and 5B is spaced apart relative to each other and relative to each oxide layer 4A and 4B, respectively. A plurality of LDD (Lightly Doped Diffusion) regions 2A, 2B and 2C are formed into the silicon substrate 1 between gate electrodes 5A and 5B, between gate electrode 5A and oxide layer 4A and between gate electrode 5B and oxide layer 4B, respectively, by ion-implanting a P-type or N-type impurity on the entire surface of the resulting structure, with each LDD regions 2A, 2B and 2C having an impurity-concentration in the range of, for example, $1 \times 10^{17} - 1 \times 10^{13} \text{ cm}^{-3}$.

Referring to FIG. 2, an oxide spacer layer, not shown, is deposited on the entire surface of the resulting structure according to the prior art, and a plurality of oxide spacers 6 are formed on both sides of the gate electrodes 5A, 5B and gate electrode lines 5C, 5D by anisotropically etching the oxide layer, to thereby expose the surface of the each gate electrode 5A, 5B and gate electrode line 5C, 5D, respectively. Then, by the ion-implantation of P-type or N-type impurity on the entire surface of the resulting structure set forth in the drawing, a plurality of diffusion regions 2D, 2E and 2F are formed, through a plurality of the LDD regions 2A, 2B and 2C into the silicon substrate 1 and which respectively function as drain electrode or a source electrode.

FIG. 3 illustrates a cross-sectional view of a plurality of MOSFETs in which, in order to prevent an impurity of a doped polysilicon layer which is to be formed later from diffusing into the exposed surface of the each gate electrode 5A, 5B and gate electrode line 5C, 5D which are exposed by the process of the anisotropic etching in connection with FIG. 2, a first insulating layer 7 is deposited on the exposed surface of the each gate electrode 5A, 5B and gate electrode line 5C, 5D utilizing a well-known process, to form a plurality of MOSFETs 30AB. The first insulating layer is preferably an oxide.

FIG. 4 through 9 are sectional views of a semiconductor device according to the process steps of the present invention for manufacturing a semiconductor device utilizing a self-aligned contact process.

Figure 4:
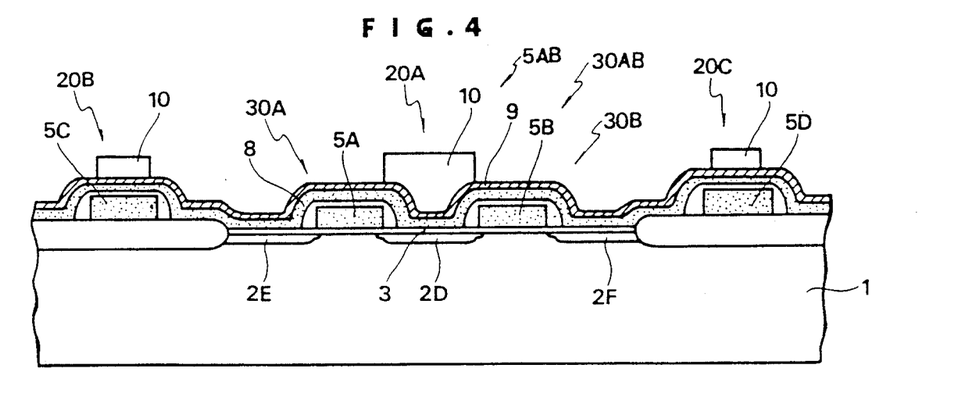
FIG. 4 illustrates a cross-sectional view in which a polysilicon layer, a nitride layer and a photoresist layer which is formed on contact regions are sequentially deposited.

Referring to FIG. 4, an undoped polysilicon layer 8 is deposited on the entire surface of the resulting structure. A nitride layer 9 is then formed over the undoped polysilicon layer 8. After a photoresist layer 10 is deposited on the entire surface of the resulting structure, the photoresist layer 10 is removed by a photoresist etch back process except for those portions of the photoresist layer 10 at contact regions 20A, 20B and 20C. Contact region 20A is positioned over diffusion region 2D which is positioned between gate electrodes 5A and 5B of MOSFETs 30A, 30B of the plurality of MOSFETs 30AB. Contact regions 20B and 20C are positioned over gate electrode lines 5C, 5D, respectively. Thus the photoresist etch back process exposes the surface of the nitride layer 9 except for the nitride layer at contact regions 20A, 20B and 20C each of which is covered by a portion of the photoresist layer 10.

However, a doped polysilicon layer which is doped with an impurity may be utilized instead of using an undoped polysilicon layer 8 as described above. That is, the doped polysilicon layer can be formed by depositing an undoped polysilicon layer on the entire surface of the resulting structure and then heating the undoped polysilicon layer at a temperature of 700-1000 degrees Celsius for a period of 10-100 minutes with the simultaneously application of POCl$_3$ (Phosphorus-Oxygen-Chlorine) gas, to thereby diffuse the impurity contained in the gas into the undoped polysilicon layer into the doped polysilicon layer such that a doped polysilicon layer is formed having an impurity-concentration of, for example, $1 \times 10^{18} - 5 \times 10^{21} \text{ cm}^{-3}$.

Alternatively, the doped polysilicon layer can also be formed by first depositing an undoped polysilicon layer 8 on the entire surface of the resulting structure, depositing thereover a solid dopant source selected from the group consisting of: BN(Boro-Nitride), BSG(Boro-Silicate-Glass), BPSG(Boro-Phospho-Silicate-Glass) or PSG(Phospho-Silicate-Glass), having a thickness of 100-2000 Angstroms, and heating the solid dopant source deposited on the undoped polysilicon layer 8 at a temperature of 700-1000 degrees Celsius for a period of 10-100 minutes, to diffuse the impurity contained the solid dopant source into the undoped polysilicon layer 8 in order to form a doped polysilicon layer having the same impurity-concentration as recited above. If a doped polysilicon layer is utilized rather than the undoped polysilicon layer 8 of FIG. 4, as described, it is unnecessary to perform an additional ion-implantation process of the impurity, which will be described in connection with FIG. 5.

Figure 5:
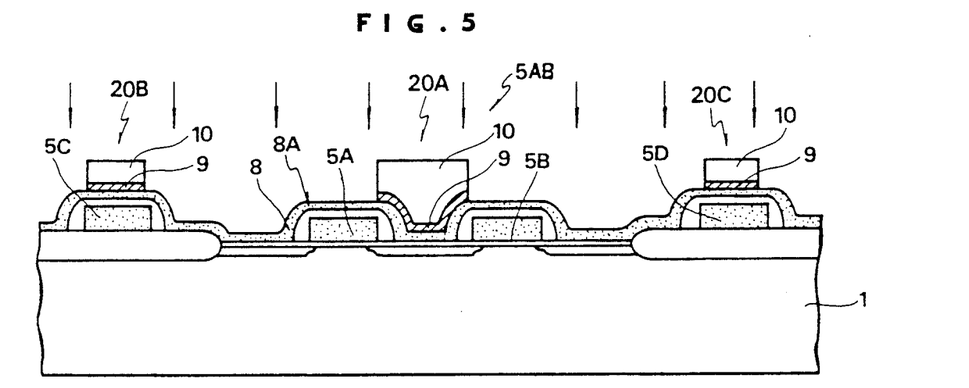
FIG. 5 illustrates a cross-sectional view in which the exposed nitride layer exposed is removed and an ion-implantation process is performed on the exposed polysilicon layer.

Referring to FIG. 5, the exposed nitride layer 9 is removed from the surface of the structure, except for that in contact portions 20A, 20B and 20C as shown in FIG. 5, to expose the underlying undoped polysilicon layer 8. In contact portions 20A, 20B and 20C the undoped polysilicon layer 8 is covered with that portion of the nitride layer 9 which is protected by the overlying photoresist layer 10 as shown in FIG. 5. During a thermal oxidation process which will be described in connection with FIG. 6, in order to enhance the growing of the thermal oxide into the undoped polysilicon layer 8, and to effectively prevent the edges of the nitride layer 9 at the contact regions 20A, 20B and 20C from being formed into a beak shape due to excessively projecting of the thermal oxide which is to be formed on the undoped polysilicon layer 8, an ion-implantation process is performed on the exposed portion of the undoped polysilicon layer 8 such that it is performed by utilizing a dopant source selected from the group consisting of: B(Boron), BF$_2$(Boron-Fluorine), P(Phosphorus) or As(Arsenic), to thereby form the exposed portion of the undoped polysilicon layer 8 into a doped polysilicon layer 8A having an impurity-concentration of $1 \times 10^{18} - 5 \times 10^{21}$ cm$^{-3}$. That is, the doped polysilicon layer 8A eventually ensure the width of each contact hole by preventing the intrusion of the thermal oxide layer into the edges of the underlying undoped polysilicon layer 8 which will be described in connection with FIG. 7.

Alternatively, the ion-implantation process may be performed before the nitride layer 9 is removed.

Figure 6:
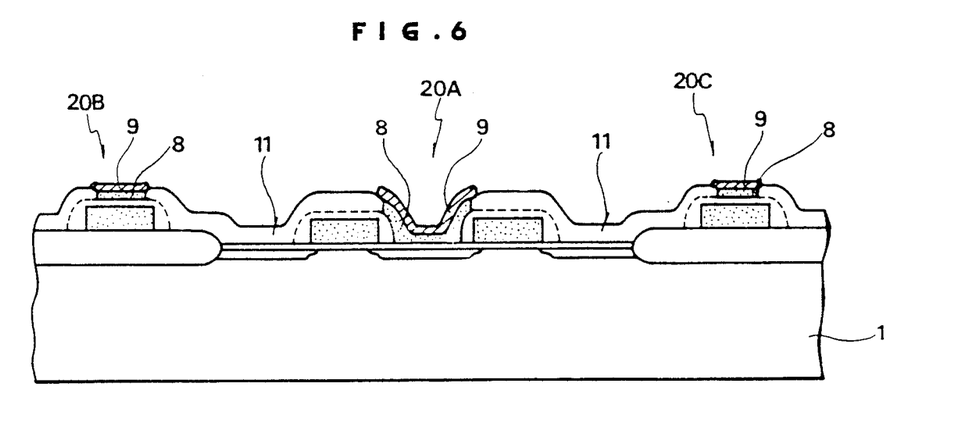
FIG. 6 illustrates a cross-sectional view in which the photoresist layer is removed and a thermal oxide layer is growing on and into the exposed polysilicon layer by thermal oxidation process.

Referring to FIG. 6, the remaining photoresist layer 10 formed at the each contact region 20A, 20B and 20C is completely removed, to thereby expose the surface of the remaining nitride layer 9 formed at the each contact region 20A, 20B and 20C. The thermal oxidation process is then performed on the entire surface of the resulting structure to thermally oxidize the exposed doped polysilicon layer 8A at a temperature of 200-1000 degrees Celsius for a period of 10-120 minutes, to form a thermal oxide layer 11 on and into the exposed doped polysilicon layer 8A, such that the exposed doped polysilicon layer 8A itself is completely and simultaneously oxidized during the thermal oxide process. Accordingly, the thickness of the thermal oxide layer 11 which also comprises each oxide spacer 6 formed at both sides of each gate electrode 5A, 5B and gate electrode line 5C, 5D, is twice the thickness as that of the firstly deposited undoped polysilicon layer 8.

It is noted that the thermal oxidation process described in FIG. 6 may be performed such a way that the exposed doped polysilicon layer 8A itself is not completely oxidized but is partially oxidized.

Figure 7:
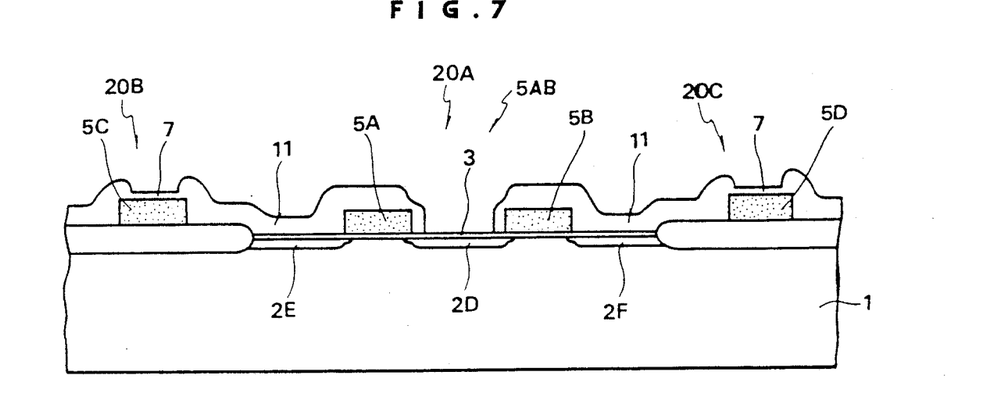
FIG. 7 illustrates a cross-sectional view in which the remaining nitride layer and polysilicon layer are removed.

Referring to FIG. 7, the remaining nitride layer 9 formed at each contact region 20A, 20B and 20C is removed, to thereby expose the underlying undoped polysilicon layer 8 thereat. The underlying undoped polysilicon layer 8 exposed thereby is removed either by anisotropically etching or by isotropically etching the same, utilizing thermal oxide layer 11 as a mask layer, to thereby expose the portion of the first oxide layer 7 formed on each gate electrode line 5C, 5D, and to expose the portion of the gate oxide layer 3 formed on the diffusion region 2D, positioned between gate electrode 5A, 5B, respectively.

Figure 8:
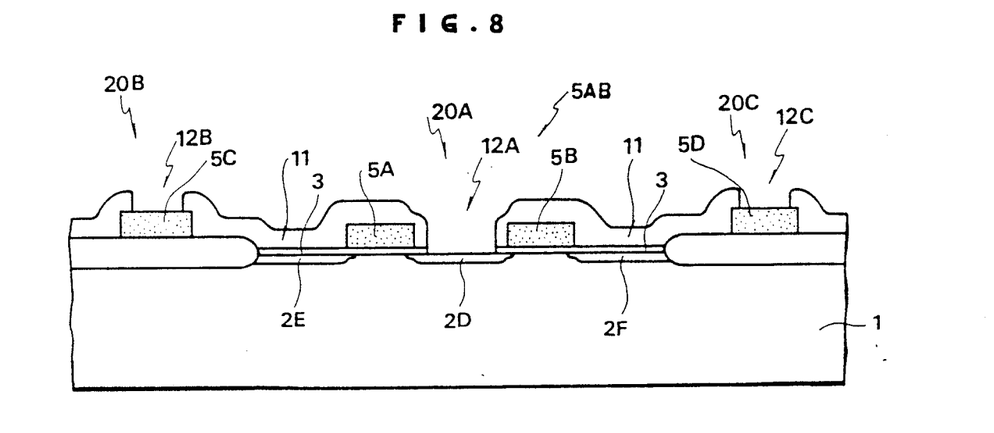
FIG. 8 illustrates a cross-sectional view in which contact holes are formed by removing the exposed first oxide layer and gate oxide layer remained in the contact region.

Referring to FIG. 8, contact holes 12A, 12B and 12C are formed at the each contact region 20A, 20B and 20C, respectively, either by isotropically etching or by anisotropically etching the thermal oxide layer 11 and the portion of the first oxide layer 7 and gate oxide layer 3 which are exposed in connection with FIG. 7, to expose the surface of each gate electrode line 5C, 5D formed on each oxide layer 4A, 4B for segment separation, respectively, and to expose the surface of the diffusion region positioned between gate electrodes 5A, 5B of the plurality of gate electrodes 5AB, respectively. At this time, when forming the contact holes, since the thickness of the gate oxide layer 3 and the first oxide layer 7 is relatively thin in comparison with that of the proximate thermal oxide layer 11, the duration of the etching process described above should be short.

Figure 9:
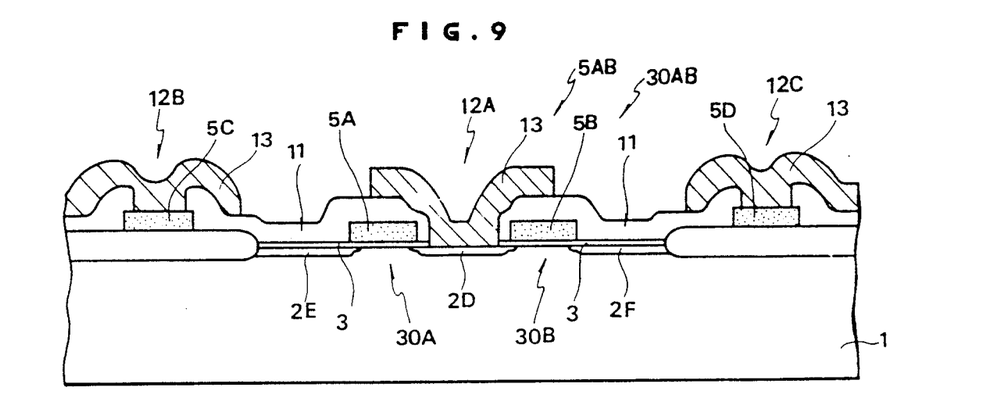
FIG. 9 illustrates a cross-sectional view in which a conducting layer is selectively deposited into the contact holes by mask patterning process thereof.

In the structure of the semiconductor device depicted in FIG. 9, a conducting layer 13 is deposited on the entire surface of the resulting structure. The conducting layer 13 is then removed by the mask patterning process from the entire surface of the resulting structure except for those portions of the conducting layer 13 which are positioned over the contact holes 12B and 12C and are in contact with gate electrode lines 5C and 5D and that portion of the conducting layer 13 which is over contact hole 12A and is in contact with diffusion region 2D, as shown in FIG. 8. Thus, the conducting layer 13 is selectively connected through each contact hole 12A, 12B and 12C, both to the diffusion region 2D positioned between MOSFETs 30A and 30B of the plurality of MOSFETs 30AB and to each gate electrode line 5C and 5D, respectively.

As described above, according to the present invention, since a conducting layer is selectively connected in self-aligned contact, through contact holes, to predetermined electrodes, a connection between the conducting layer and the predetermined electrodes which are to be connected to each other is successfully achieved within a more decreased cell size, while maintaining a sufficient thickness of the insulating layer between the conducting layer and the other electrodes which have to be insulated from each other, so that it is applicable in highly integrated semiconductor technologies. Furthermore, according to the invention, when forming contact holes, since a distance may be not required for a minimum misalignment tolerance required for the mask patterning process and a critical dimension loss occurred during the lithographic etching process as mentioned in the opening paragraph, so the process for manufacturing a semiconductor device decreases. Furthermore, since the thermal oxide layer having a sufficient thickness is formed on the electrodes which must be insulated from the other, the occurrence of parasitic capacitance between one another is avoided.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for forming a semiconductor device which comprises a plurality of segment separation oxide layers formed on a silicon substrate, with each segment separation oxide layer being spaced apart relative to each other; a plurality of MOSFETs formed on the silicon substrate in which each MOSFET includes a plurality of diffusion regions formed into the silicon substrate between the segment separation oxide layers, with each diffusion region being spaced apart relative to each other and having a lightly doped diffusion region, a gate oxide layer formed on the silicon substrate extending between the spaced apart segment separation oxide layers, and a plurality of gate electrodes formed on the gate oxide layer, with each gate electrode being spaced apart relative to each other and relative to each segment separation oxide layer; a plurality of gate electrode lines formed on each segment separation oxide layer with oxide spacers formed on each side of each gate electrode and each gate electrode line; and a first insulating layer formed on each gate electrode and each gate electrode line, wherein the improvement for forming the semiconductor device to selectively connect a conducting layer to each diffusion region positioned between MOSFETs of the plurality of MOSFETs, and to each gate electrode line by utilizing a self-aligned contact process, comprises:

sequentially depositing an undoped polysilicon layer, a nitride layer and a photoresistive layer on the entire surface of the resulting semiconductor device;

removing the photoresist layer except for those portions of the photoresist layer positioned above each gate electrode lines and above each diffusion region of the plurality of diffusion regions positioned between adjacent gate electrodes of the plurality of gate electrodes to thereby define contact regions positioned over each diffusion region which is positioned between the gate electrodes of the MOSFETs of the plurality of MOSFETs, and over each gate electrode lines, respectively, thereby exposing the nitride layer except for those portions of the nitride layer positioned at the contact regions;

removing the nitride layer except for those portions of the nitride layer positioned at the defined contact regions, thereby exposing portions of the undoped polysilicon layer;

performing an ion-implantation process on the exposed portions of the undoped polysilicon layer to thereby form the exposed portions of the undoped polysilicon layer into a doped polysilicon layer;

removing the photoresist layer remaining above each gate electrode line and above each diffusion region of the plurality of diffusion regions positioned between adjacent gate electrodes, thereby exposing the nitride layer remained at the contact regions;

thermally oxidizing the exposed doped polysilicon layer, thereby forming a thermal oxide layer on and into the exposed dope polysilicon layer;

sequentially removing the exposed nitride layer and the exposed underlying undoped polysilicon layer remaining at the defined contact regions to thereby expose the first insulating layer formed on each gate electrode line and to expose the gate oxide layer formed on each gate electrode line and to expose the gate oxide layer formed over the diffusion region positioned between the gate electrodes, respectively;

forming a contact hole at each contact region by etching the thermal oxide layer, the exposed gate oxide layer positioned over the diffusion region and the first insulating layer positioned on the each gate electrode lines and a surface of each diffusion region positioned between gate electrodes of the plurality of gate electrodes, respectively;

depositing a conducting layer on the entire surface of the resulting structure comprising the thermal oxide layer and the contact holes; and removing the conducting layer except for those portions of the conducting layer deposited in and proximate to each contact hole such that each portion of the conducting layer forms a contact at each gate electrode lines, respectively, and a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

2. The method of claim 1 wherein the first insulating layer is formed with oxide.

3. The method of claim 1 wherein the ion-implantation of the exposed undoped polysilicon layer is performed utilizing a dopant source selected from the group consisting of: B(Boron), BF$_2$(Boron-Fluorine), P(Phosphorus) or As (Arsenic), to thereby form the exposed portion of the undoped polysilicon layer into a doped polysilicon layer having an impurity-concentration of $1 \times 10^{18} - 5 \times 10^{21}$ cm$^{-3}$.

4. The method of claim 1 wherein the thermal oxidation of the exposed doped polysilicon layer is performed by thermally oxidizing the exposed doped polysilicon layer at a temperature of 200-1000 degree Celsius for a period of 10-120 minutes.

5. A method for forming a semiconductor device which comprises a plurality of segment separation oxide layers formed on a silicon substrate, with each segment separation oxide layer being spaced apart relative to each other; a plurality of MOSFETs formed on the silicon substrate in which each MOSFET includes a plurality of diffusion regions formed into the silicon substrate between the segment separation oxide layers, with each diffusion region being spaced apart relative to each other and having a lightly doped diffusion region, a gate oxide layer formed on the silicon substrate extending between the spaced apart segment separation oxide layers, and a plurality of gate electrodes formed on the gate oxide layer, with each gate electrode being spaced apart relative to each other and relative to each segment separation oxide layer; a plurality of gate electrode lines formed on each segment separation oxide layer with oxide spacers formed on each side of each gate electrode and each gate electrode line; and a first insulating layer formed on each gate electrode and each gate electrode line, wherein the improvement for forming the semiconductor device to selectively connect a conducting layer to each diffusion region positioned between MOSFETs of the plurality of MOSFETs, and to each gate electrode line by utilizing a self-aligned contact process, comprises:

sequentially depositing an undoped polysilicon layer, a nitride layer and a photoresistive layer on the entire surface of the resulting semiconductor device;

removing the photoresist layer except for those portions of the photoresist layer positioned above each gate electrode line and above each diffusion region of the plurality of diffusion regions positioned between adjacent gate electrodes of the plurality of gate electrodes to thereby define contact regions positioned over each diffusion region which is positioned between the gate electrodes of the MOSFETs of the plurality of MOSFETs, and over each gate electrode lines, respectively, thereby exposing the nitride layer except for those portions of the nitride layer positioned at the contact regions;

removing the nitride layer except for those portions of the nitride layer positioned at the defined contact regions, thereby exposing portions of the undoped polysilicon layer;

performing an ion-implantation process on the exposed portions of the undoped polysilicon layer utilizing a dopant source selected form the group consisting of: B(Boron), BF$_2$ (Boron-Fluorine), P(Phosphorus) or As(Arsenic), the thereby form the exposed portions of the undoped polysilicon layer into a doped polysilicon layer having an impurity-concentration of $1 \times 10^{18} - 5 \times 10^{21}$ cm$^{-3}$;

removing the photoresist layer remaining above each gate electrode line and above each diffusion region of the plurality of diffusion regions positioned between adjacent gate electrodes, thereby exposing the nitride layer remained at the contact regions;

thermally oxidizing the exposed doped polysilicon layer at a temperature of 200-1000 degree Celsius for a period of 10-120 minutes thereby forming a thermal oxide layer on and into the exposed doped polysilicon layer;

sequentially removing the exposed nitride layer and the exposed underlying undoped polysilicon layer remaining at the defined contact regions to thereby expose the first insulating layer formed on each gate electrode line and to expose the gate oxide layer formed on each gate electrode line and to expose the gate oxide layer formed over the diffusion region positioned between the gate electrodes, respectively;

forming a contact hole at each contact region by etching the thermal oxide layer, the exposed gate oxide layer positioned over the diffusion region and the first insulating layer positioned on the each gate electrode line to expose a surface of each gate electrode lines and a surface of each diffusion region positioned between gate electrodes of the plurality of gate electrodes, respectively;

depositing a conducting layer on the entire surface of the resulting structure comprising the thermal oxide layer and the contact holes; and removing the conducting layer except for those portions of the conducting layer deposited in and proximate to each contact hole such that each portion of the conducting layer forms a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

6. The method of claim 5 wherein the first insulating layer is formed with oxide.

7. A method for forming a semiconductor device which comprises a plurality of segment separation oxide layers formed on a silicon substrate, with each segment separation oxide layer being spaced apart relative to each other; a plurality of MOSFETs formed on the silicon substrate in which each MOSFET includes a plurality of diffusion regions formed into the silicon substrate between the segment separation oxide layers, with each diffusion region being spaced apart relative to each other and having a lightly doped diffusion region, a gate oxide layer formed on the silicon substrate extending between the spaced apart segment separation oxide layers, and a plurality of gate electrodes formed on the gate oxide layer, with each gate electrode being spaced apart relative to each other and relative to each segment separation oxide layer; a plurality of gate electrode lines formed on each segment separation oxide layer with oxide spacers formed on each side of each gate electrode and each gate electrode line; and a first insulating layer formed on each gate electrode and each gate electrode line, wherein the improvement for forming the semiconductor device to selectively connect a conducting layer to each diffusion region positioned between MOSFETs of the plurality of MOSFETs, and to each gate electrode line by utilizing a self-aligned contact process, comprises:

depositing an undoped polysilicon layer on the entire surface of the resulting semiconductor device;

doping the undoped polysilicon layer to form a doped polysilicon layer;

sequentially depositing a nitride layer and a photoresistive layer over the doped polysilicon layer;

removing the photoresist layer except for those portions of the photoresist layer positioned above each gate electrode line and above each diffusion region of the plurality of diffusion regions positioned between adjacent gate electrodes of the plurality of gate electrodes to thereby define contact regions positioned over each diffusion region which is positioned between the gate electrodes of the MOSFETs of the plurality of MOSFETs, and over each gate electrode lines, respectively, thereby exposing the nitride layer except for those portions of the nitride layer positioned at the contact regions;

removing the nitride layer except for those portions of the nitride layer positioned at the defined contact regions, thereby exposing portions of the undoped polysilicon layer;

removing the photoresist layer remaining above each gate electrode line and above each diffusion region of the plurality of diffusion regions positioned between adjacent gate electrodes, thereby exposing the nitride layer remained at the contact regions;

thermally oxidizing the exposed doped polysilicon layer, thereby forming a thermal oxide layer on and into the exposed doped polysilicon layer;

sequentially removing the exposed nitride layer and the exposed underlying undoped polysilicon layer remaining at the defined contact regions to thereby expose the first insulating layer formed on each gate electrode line and to expose the gate oxide layer formed over the diffusion region positioned between the gate electrodes, respectively;

forming a contact hole at each contact region by etching the thermal oxide layer, the exposed gate oxide layer positioned over the diffusion region and the first insulating layer positioned on the each gate electrode line to expose a surface of each gate electrode lines and a surface of each diffusion region positioned between gate electrodes of the plurality of gate electrodes, respectively;

depositing a conducting layer on the entire surface of the resulting structure comprising the thermal oxide layer and the contact holes; and removing the conducting layer except for those portions of the conducting layer deposited in and proximate to each contact hole such that each portion of the conducting layer forms a contact at each gate electrode lines, respectively, and a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

8. The method of claim 7 wherein the first insulating layer is formed with oxide.

9. The method of claim 7 wherein the doping process of the undoped polysilicon layer is performed by heating the undoped polysilicon layer at a temperature of 700-1000 C degree Celsius for a period of 10-100 minutes simultaneously with application of $POCl_3$ (Phosphorus-Oxygen-Chlorine) gas, to thereby diffuse the impurity contained the gas into the undoped polysilicon layer, in order to form a doped polysilicon layer having an impurity-concentration of $1 \times 10^{18} - 5 \times 10^{21}$ cm$^{-3}$.

10. The method of claim 7 wherein the doping process of the undoped polysilicon layer is performed by depositing on the undoped polysilicon layer a solid dopant source selected from the group consisting of: BN (Boron-Nitride), BSG (Boro-Silicate-Glass), BPSG (Boro-Phospho-Silicate-Glass) or PSG (Phospho-Silicate-Glass), having a thickness of 100-2000 Angstroms, and heating the solid dopant source deposited on the undoped polysilicon layer at a temperature of 700-1000 degree Celsius for a period of 10-100 minutes, to thereby diffuse the impurity contained the solid dopant source into the undoped polysilicon layer, in order to form a doped polysilicon having an impurity-concentration of $1 \times 10^{18} - 5 \times 10^{21}$ cm$^{-3}$.

11. The method of claim 7 wherein the thermal oxidation of the doped polysilicon layer is performed by thermally oxidizing the exposed doped polysilicon layer at a temperature of 200-1000 degree Celsius for a period of 10-120 minutes.

12. A method for manufacturing a semiconductor device, comprising:

forming a plurality of segment separation oxide layers on a silicon substrate, with each segment separation oxide layer being spaced apart relative to one another;

depositing a gate oxide layer on the silicon substrate extending between the spaced apart segment separation oxide layers;

depositing a first conductive layer over the entire surface of the resulting structure;

removing portions of the first conducting layer to form a plurality of gate electrodes on the gate oxide layers and to form a plurality of gate electrode lines on the segment separation oxide layers, with each gate electrode being spaced apart relative to one another;

forming a plurality of lightly doped diffusion regions into portions of the silicon substrate between the spaced apart segment separation oxide layers and the gate electrodes;

depositing an spacer oxide layer on the entire surface of the resulting structure and forming from the spacer oxide layer a plurality of oxide spacers with an oxide spacer being formed on each side of each gate electrode of the plurality of gate electrodes and on each side of each gate electrode line of the plurality of gate electrode lines;

forming a plurality of diffusion regions through each lightly doped diffusion region of the plurality of lightly doped diffusion regions into the silicon substrate with each diffusion region of the plurality of diffusion regions functioning, in use, as a drain electrode or a source electrode;

forming a plurality of MOSFETs by depositing a first insulating layer on each gate electrode, each gate electrode line and each oxide spacer of the plurality of oxide spacers;

depositing an undoped polysilicon layer on the entire surface of the resulting structure;

sequentially depositing a nitride layer and a photoresist layer over the undoped polysilicon layer;

removing the photoresist layer except for those portions of the photoresist layer positioned above each gate electrode line and above each diffusion region of the plurality of diffusion regions positioned between adjacent gate electrodes of the plurality of gate electrodes to thereby define contact regions positioned over each diffusion region positioned between the gate electrodes of the MOSFETs of the plurality of MOSFETs, and over each gate electrode lines, respectively, thereby exposing the nitride layer except for those portions of the nitride layer positioned at the contact regions;

removing the nitride layer except for those portions of the nitride layer positioned at the defined contact regions, thereby exposing portions of the undoped polysilicon layer;

performing an ion-implantation process on the exposed portions of the undoped polysilicon layer to thereby form the exposed portions of the undoped polysilicon layer into a doped polysilicon layer;

removing the photoresist layer remaining above each gate electrode line and above each diffusion region of the plurality of diffusion regions positioned between adjacent gate electrodes, thereby exposing the nitride layer remaining at the contact regions;

thermally oxidizing the exposed doped polysilicon layer, thereby forming a thermal oxide layer on and into the exposed doped polysilicon layer;

sequentially removing the exposed nitride layer and the exposed underlying undoped polysilicon layer remaining at the defined contact regions to thereby expose the first insulating layer formed on each gate electrode line and to expose the gate oxide layer formed over the diffusion region positioned between the gate electrode, respectively;

forming a contact hole at each contact region by etching the thermal oxide layer, the exposed gate oxide layer positioned over the diffusion region and the first insulating layer positioned on the each gate electrode line to expose a surface of each gate electrode lines and a surface of each diffusion region positioned between gate electrodes of the plurality of gate electrodes, respectively;

depositing a second conducting layer on the entire surface of the resulting structure comprising the thermal oxide layer and the contact holes; and removing the second conducting layer except for those portions of the second conductive layer deposited in and proximate to each contact hole such that each portion of the conducting layer forms a contact at each gate electrode lines, respectively, and a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

13. The method for manufacturing a semiconductor of claim 12 wherein the ion-implantation process utilized a dopant source selected from the group consisting of: B(Boron), BF$_2$ (Boron-Fluorine), P(Phosphorus) or As(Arsenic), to thereby form the exposed portion of the undoped polysilicon layer into a doped polysilicon layer 8A having an impurity-concentration of $1 \times 10^{18} - 5 \times 10^{21}$ cm$^{-3}$.

14. The method of claim 12 wherein the thermal oxidation of the exposed doped polysilicon layer is performed by thermally oxidizing the exposed polysilicon layer at a temperature of 200-1000 degree Celsius for a period of 10-120 minutes.

15. A method for manufacturing a semiconductor device, comprising:

forming a plurality of segment separation oxide layers on a silicon substrate, with each segment separation oxide layer being spaced apart relative to one another;

depositing a gate oxide layer on the silicon substrate extending between the spaced apart segment separation oxide layers;

depositing a first conducting layer over the entire surface of the resulting structure;

removing portions of the first conducting layer to form a plurality of gate electrodes on each portion of the gate oxide layer and to form a plurality of gate electrode lines with each gate electrode line formed on a portion of each segment separation oxide layer and with each gate electrode being spaced apart relative to one another;

forming a plurality of lightly doped diffusion regions into portions of the silicon substrate between the spaced apart segment separation oxide layers and the gate electrodes;

depositing an spacer oxide layer on the entire surface of the resulting structure and forming from the spacer oxide layer a plurality of oxide spacers with an oxide spacer being formed on each side of each gate electrode of the plurality of gate electrodes and on each side of each gate electrode line of the plurality of gate electrode lines;

forming a plurality of diffusion regions through each lightly doped diffusion region of the plurality of lightly doped diffusion regions into the silicon substrate with each diffusion region of the plurality of diffusion regions functioning, in use, as a drain electrode or a source electrode;

forming a plurality of MOSFETs by depositing a first insulating layer on each gate electrode, each gate electrode line and each oxide spacer of the plurality of oxide spacers;

depositing an undoped polysilicon layer on the entire surface of the resulting structure;

doping the undoped polysilicon layer on the entire surface of the resulting structure;

doping the undoped polysilicon layer to form a doped polysilicon layer;

sequentially depositing a nitride layer and a photoresist layer over the doped polysilicon layer;

removing portions of the photoresist layer except for those portions of the photoresist layer positioned above each gate electrode line and above each diffusion region of the plurality of diffusion regions positioned between adjacent gate electrodes of the plurality of gate electrodes to thereby define contact regions positioned over each diffusion region positioned between the gate electrodes of the MOSFETs of the plurality of MOSFETs, and over each gate electrode lines, respectively, thereby exposing the nitride layer except for those portions of the nitride layer positioned at the contact regions;

removing the nitride layer except for those portions of the nitride layer positioned at the defined contact regions, thereby exposing portions of the doped polysilicon layer;

removing the photoresist layer remaining above each gate electrode line and above each diffusion region of the plurality of diffusion regions positioned between adjacent gate electrodes, thereby exposing the nitride layer remaining at the contact regions;

thermally oxidizing the exposed doped polysilicon layer, thereby forming a thermal oxide layer on and into the exposed doped polysilicon layer;

sequentially removing the exposed nitride layer and the exposed underlying doped polysilicon layer remaining at the defined contact regions to thereby expose the first insulating layer formed on each gate electrode line and to expose the gate oxide layer formed over the diffusion region positioned between the gate electrodes, respectively;

forming a contact hole at each contact region by etching the thermal oxide layer, the exposed gate oxide layer positioned over the diffusion region and the first insulating layer positioned on the each gate electrode line to expose a surface of each gate electrode lines and a surface of each diffusion region positioned between gate electrodes of the plurality of gate electrodes, respectively;

depositing a second conducting layer on the entire surface of the resulting structure comprising the thermal oxide layer and the contact holes; and removing the second conducting layer except for those portions of the conducting layer deposited in and proximate to each contact hole such that each portion of the second conducting layer forms a contact at each gate electrode lines, respectively, and a contact at each diffusion region positioned between MOSFETs of the plurality of MOSFETs, thereby enabling a selective connection to be made at each diffusion region positioned between MOSFETs of the plurality of MOSFETs and at each gate electrode line, respectively.

16. The method of claim 15 wherein the undoped polysilicon is doped by heating the undoped polysilicon layer at a temperature of 700–1000 degrees Celsius for a period of 10–100 minutes with the simultaneously application of $POCl_3$ (Phosphorus-Oxygen-Chlorine) gas, to thereby diffuse the impurity contained the gas into the undoped polysilicon such that a doped polysilicon layer is formed.

17. The method of claim 16 wherein the doped polysilicon layer has an impurity-concentration of about $1 \times 10^{18} - 5 \times 10^{21}$ cm$^{-3}$.

18. The method of claim 16 wherein the undoped polysilicon layer is doped by depositing on the undoped polysilicon layer a solid dopant source selected from the group consisting of: BN(Boro-Nitride), BSG(Boro-Silicate-Glass)m, BPSG(Boro-Phospho-Silicate-Glass) or PSG(Phospho-Silicate-Glass), having a thickness of 100–2000 Angstroms, and heating the solid dopant source deposited on the undoped polysilicon layer at a temperature of 700–1000 degrees Celsius for a period of 10–100 minutes, to diffuse the impurity contained the solid dopant source into the undoped polysilicon layer in order to form a doped polysilicon layer.

19. The method of claim 18 wherein the doped polysilicon layer has an impurity-concentration of about $1 \times 10^{18} - 5 \times 10^{21}$ cm$^{-3}$.

20. The method of claim 15 wherein the thermal oxidation of the exposed doped polysilicon layer is performed by thermally oxidizing the exposed doped polysilicon layer at a temperature of 200–1000 degrees Celsius for a period of 10–120 minutes.

* * * * *

UNITED STATES PATENT AND TRADEMARK OFFICE
CERTIFICATE OF CORRECTION

PATENT NO. : 5,066,604  
DATED : November 19, 1991  
INVENTOR(S) : Chung et al.

Page 1 of 7

It is certified that error appears in the above-identified patent and that said Letters Patent is hereby corrected as shown below:

Column 2, line 16; insert --a-- after the word "for".

Column 2, line 32; "lines" should read as --line--.

Column 2, line 59; "lines" should read as --line--.

Column 3, line 7; "diffusions" should read as --diffusion--.

Column 3, line 18; delete "the" after the word "on".

Column 3, line 19; "lines" should read as --line--.

Column 3, line 28; "lines" should read as --line--.

Column 3, line 48; "700°-1000°C.degree" should read as --700-1000 degrees.

Column 3, line 49; "simultaneously" should read as --simultaneous--.

Column 3, line 51; insert --in-- after the word "contained".

Column 3, line 62; insert --in-- after the word "contained".

Column 4, line 2; "diffusions" should read as --diffusion--.

UNITED STATES PATENT AND TRADEMARK OFFICE
CERTIFICATE OF CORRECTION

PATENT NO. : 5,066,604
DATED : November 19, 1991
INVENTOR(S) : Chung et al.

It is certified that error appears in the above-identified patent and that said Letters Patent is hereby corrected as shown below:

Column 4, line 4; insert --a-- after the word "is".

Column 4, line 11; "abut" should read as --about--.

Column 4, line 50; delete "exposed" after the word "layer".

Column 5, line 4; insert --a-- after the word "of".

Column 5, line 15; insert --a-- after the word "for".

Column 5, line 23; delete "the" after the word "of".

Column 5, line 41; insert --spacer- after the word "oxide".

Column 5, line 53; delete "the" after the word "of".

Column 5, line 57; delete "the" after the word "of".

Column 6, lines 21 & 22; "simultaneously" should read --simultaneous--.

Column 6, line 38; insert --in-- after the word "contained".

Column 6, line 61; delete "of" after the word "projecting".

UNITED STATES PATENT AND TRADEMARK OFFICE
CERTIFICATE OF CORRECTION

PATENT NO. : 5,066,604

DATED : November 19, 1991

INVENTOR(S) : Chung et al.

It is certified that error appears in the above-identified patent and that said Letters Patent is hereby corrected as shown below:

Column 7, line 3; "ensure" should read as --ensures--.

Column 7, line 11; delete "the" after the word "at".

Column 7, line 13; delete "the" after the word "at".

Column 7, line 29; insert --in-- after the word "performed".

Column 7, line 43; "electrode" should read --electrodes--.

Column 7, line 45; delete "the" after the word "at".

Column 8, line 20; "be not" should read as --not be--.

Column 8, line 28; "the" should read as --each--.

Column 9, line 3, claim 1; "lines" should read as --line--.

Column 9, line 10, claim 1; "lines" should read as --line--.

Column 9, line 26, claim 1; "remained" should read as --remaining--.

Column 9, line 43, claim 1; delete "the" after the word "on".

Column 9, line 44, claim 1; "lines" should read as --line--.

UNITED STATES PATENT AND TRADEMARK OFFICE
CERTIFICATE OF CORRECTION

PATENT NO. : 5,066,604
DATED : November 19, 1991
INVENTOR(S) : Chung et al.

It is certified that error appears in the above-identified patent and that said Letters Patent is hereby corrected as shown below:

Column 9, line 54, claim 1; "lines" should read as --line--.

Column 10, line 48, claim 5; "lines" should read as --line--.

Column 10, line 58, claim 5; "form" should read as --from--.

Column 10, line 60, claim 5; "the" should read as --to--.

Column 10, line 68, claim 5; "remained" should read as --remaining--.

Column 11, line 18, claim 5; delete "the" after the word "on".

Column 11, line 20, claim 5; "lines" should read as --line--.

Column 11, line 29, claim 5; insert --gate electrode line, respectively, and a contact at each-- after the word "each".

Column 12, line 12, claim 7; "lines" should read as --line--.

UNITED STATES PATENT AND TRADEMARK OFFICE
CERTIFICATE OF CORRECTION

PATENT NO.  : 5,066,604

DATED       : November 19, 1991

INVENTOR(S) : Chung et al.

It is certified that error appears in the above-identified patent and that said Letters Patent is hereby corrected as shown below:

Column 12, line 24, claim 7; "remained" should read as --remaining--.

Column 12, line 39, claim 7; delete "the" after the word "on".

Column 12, line 41, claim 7; "lines" should read as --line--.

Column 12, line 51, claim 7; "lines" should read as --line--.

Column 12, line 63, claim 9; "700-1000 C. degree Celsius" should read as --700-1000 degrees Celsius--.

Column 12, line 66, claim 9; insert --in-- after the word "contained".

Column 13, line 11, claim 10; insert --in-- after the word "contained".

Column 13, line 29, claim 12; "conductive" should read --conducting--.

Column 14, line 3, claim 12; "lines" should read as --line--.

Column 14, line 29, claim 12; "electrode" should read --electrodes--.

UNITED STATES PATENT AND TRADEMARK OFFICE
CERTIFICATE OF CORRECTION

PATENT NO. : 5,066,604
DATED : November 19, 1991
INVENTOR(S) : Chung et al.

It is certified that error appears in the above-identified patent and that said Letters Patent is hereby corrected as shown below:

Column 14, line 33, claim 12; delete "the" after the word --on--.

Column 14, line 35, claim 12; "lines" should read as --line--.

Column 14, line 42, claim 12; "conductive" should read as --conducting--.

Column 14, line 45, claim 12; "lines" should read as --line--.

Column 14, line 53 & 54, claim 13; "utilized" should read as --utilizes--.

Column 15, line 53, claim 15; "lines" should read as --line--.

Column 16, line 14, claim 15; delete "the" after the word "on".

Column 16, line 16, claim 15; "lines" should read as --line--.

Column 16, line 26, claim 15; "lines" should read as --line--.

UNITED STATES PATENT AND TRADEMARK OFFICE
CERTIFICATE OF CORRECTION

PATENT NO. :  5,066,604
DATED      :  November 19, 1991
INVENTOR(S):  Chung et al.

It is certified that error appears in the above-identified patent and that said Letters Patent is hereby corrected as shown below:

Column 16, line 36, claim 16; "simultaneously" should read --simultaneous--.

Column 16, line 38, claim 16; insert --in-- after the word "contained".

Column 16, line 53, claim 18; insert --in-- after the word "contained".

Signed and Sealed this

Second Day of November, 1993

Attest:

BRUCE LEHMAN

Attesting Officer

Commissioner of Patents and Trademarks